(12) United States Patent
Peng et al.

(10) Patent No.: US 11,543,870 B2
(45) Date of Patent: Jan. 3, 2023

(54) POWER SYSTEM AND OPERATION METHOD THEREOF

(71) Applicant: DELTA ELECTRONICS, INC., Taoyuan (TW)

(72) Inventors: Te-Chih Peng, Taoyuan (TW); Ming-Hsiang Lo, Taoyuan (TW); Sung-Yueh Chen, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 115 days.

(21) Appl. No.: 17/143,176

(22) Filed: Jan. 7, 2021

(65) Prior Publication Data

US 2021/0223842 A1 Jul. 22, 2021

(30) Foreign Application Priority Data

Jan. 21, 2020 (CN) .......................... 202010070007.6

(51) Int. Cl.
*G06F 1/28* (2006.01)
*H05K 7/14* (2006.01)

(52) U.S. Cl.
CPC ............. *G06F 1/28* (2013.01); *H05K 7/1492* (2013.01)

(58) Field of Classification Search
CPC ................................ G06F 1/28; H05K 7/1492
See application file for complete search history.

(56) References Cited

U.S. PATENT DOCUMENTS

| 10,342,144 B1 * | 7/2019 | Chiu ................... H05K 7/20136 |
| 2005/0081069 A1 | 4/2005 | Pincu et al. |
| 2013/0049476 A1 * | 2/2013 | Lathrop ................... H02J 9/066 307/80 |
| 2018/0101206 A1 | 4/2018 | Chapel et al. |

OTHER PUBLICATIONS

The pertinent parts of U.S. Publication No. 20180101206A1.
The pertinent parts of U.S. Publication No. 20050081069A1.

* cited by examiner

*Primary Examiner* — Mark A Connolly
(74) *Attorney, Agent, or Firm* — CKC & Partners Co., LLC

(57) ABSTRACT

The present disclosure provides a power system that includes a set of power devices and addressing lines. The set of power devices are electrically connected to a main power source, a standby power source and a server node. The addressing lines are electrically connected to the set of power devices, so that the set of power devices can correspond to a plurality of different addressing signals respectively. The set of power devices are switched at different times based on the different addressing signals, so that one of the main power source or the standby power source supplies power to the server node though the set of power devices.

17 Claims, 6 Drawing Sheets

POWER SYSTEM AND OPERATION METHOD THEREOF

CROSS-REFERENCE TO RELATED APPLICATION

This application claims priority to China Application Serial Number 202010070007.6, filed Jan. 21, 2020, which is herein incorporated by reference in its entirety.

BACKGROUND

Field of Invention

The present invention relates to systems and methods, and more particularly, power systems and operation methods thereof.

Description of Related Art

Nowadays, the backup system has been widely used in various data centers and server power input stages, and its purpose is to improve the reliability and flexibility of power supply. In recent years, under the requirements of system space and equipment capacity utilization rate, realizing of the backup circuits is changed from the individual units of the system, being integrated into the power unit, to using a centralized power module management manner to distribute power to the server modules. However, for the current backup system in the main/standby power supply switching system, the inrush current will be generated during the switching process, which easily causes the upstream circuit breaker to trip, thereby causing the power supply module in the server cabinet to trip and the server to be powered off.

In view of above, the above-mentioned existing backup system obviously still has inconveniences and defects and needs to be further improved. Therefore, there is an urgent need in the related field to effectively reduce and disperse the inrush current.

SUMMARY

In one or more various aspects, the present disclosure is directed to power systems and operation methods thereof.

An embodiment of the present disclosure is related to a power system includes a set of power devices and an addressing line. The set of power devices are electrically connected to a main power source, a standby power source and a server node. The addressing line is electrically connected to the set of power devices, so that the set of power devices correspond to a plurality of different addressing signals respectively. The set of power devices are switched at different times based on the different addressing signals, so that one of the main power source or the standby power source supplies power to the server node though the set of power devices.

Another embodiment of the present disclosure is related to an operation method of the power system. The power system comprising a set of power devices and an addressing line. The method includes steps of: using the addressing line to make the set of power devices correspond to a plurality of the different addressing signals respectively, where the set of power devices are electrically connected to a main power source, a standby power source and a server node; in response to that the main power source is switched to the standby power source or the standby power source is switched to the main power source, switching the set of power devices at different times based on the different addressing signals, so that the switched standby power source or the switched main power source supplies power to the server node through the set of the power devices.

Yet another embodiment of the present disclosure is related to an operation method of the power system. The power system comprising a set of power devices and an addressing line. The method includes steps of: using the addressing line to make the set of power devices correspond to a plurality of the different addressing signals respectively, where the set of power devices are electrically connected to a power source and a server node; in response to that the set of power devices start to initially receive power from the power source, switching the set of power devices at different times based on the different addressing signals, so that the power source supplies the power for the server node through the set of the power devices.

Technical advantages are generally achieved, by embodiments of the present disclosure. The power system and the operation method can effectively reduce and disperse the inrush current.

Many of the attendant features will be more readily appreciated, as the same becomes better understood by reference to the following detailed description considered in connection with the accompanying drawings.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
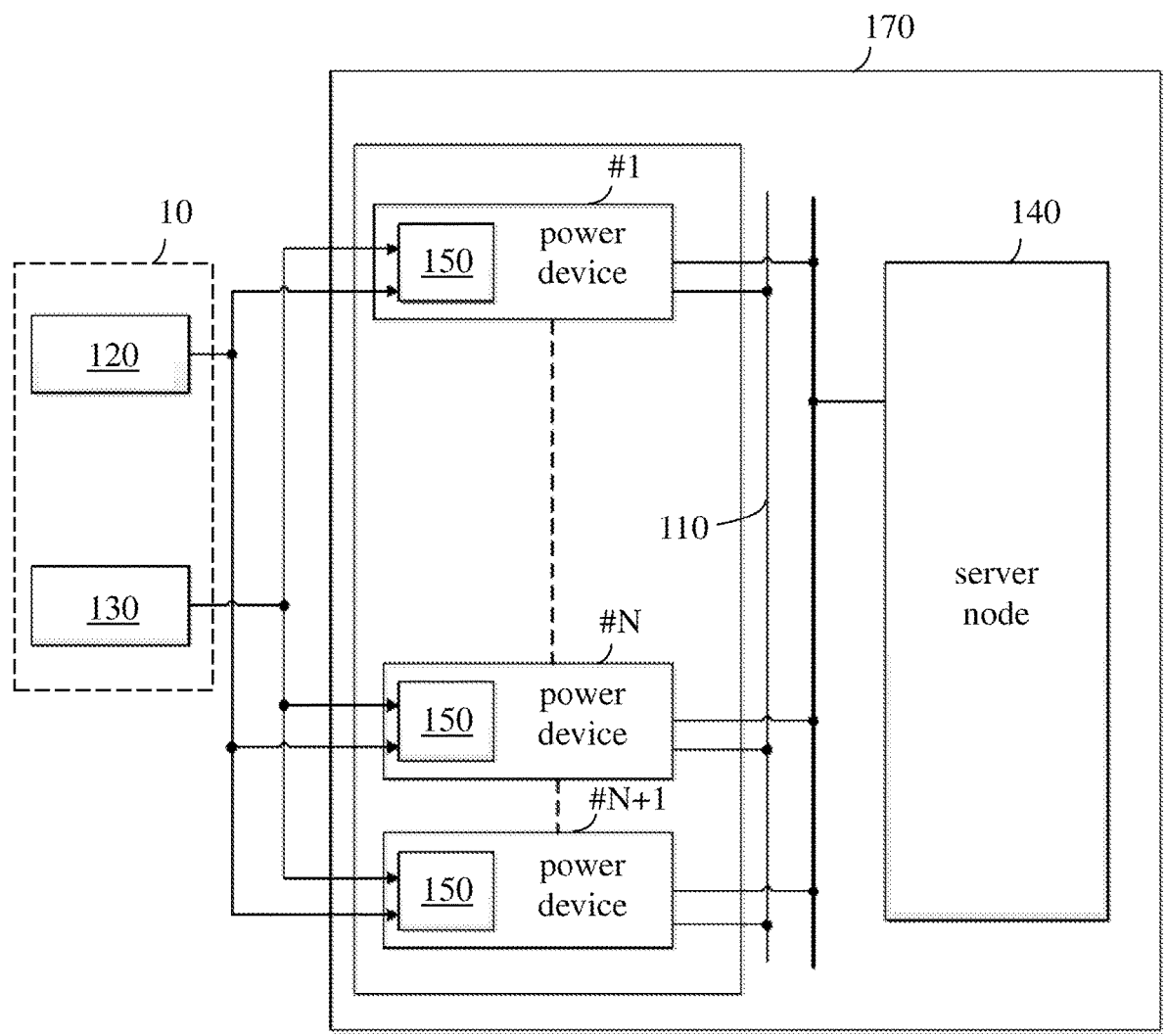
FIG. 1 is a block diagram of a power system according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

As used in the description herein and throughout the claims that follow, the meaning of "a", "an", and "the" includes reference to the plural unless the context clearly dictates otherwise. Also, as used in the description herein and throughout the claims that follow, the terms "comprise or comprising", "include or including", "have or having", "contain or containing" and the like are to be understood to be open-ended, i.e., to mean including but not limited to. As used in the description herein and throughout the claims that follow, the meaning of "in" includes "in" and "on" unless the context clearly dictates otherwise.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram of a power system 100 according to one embodiment of the present disclosure. As shown in FIG. 1, the power system 100 includes a set of power devices #1-#N+1 and an addressing line 110. In structure, the set of power devices #1-#N+1 are electrically connected to a power source 10 and a server node 140, where the power source 10 can includes a main power source 120, a standby power source 130. The addressing line 110 is electrically connected to the set of power devices #1-#N+1, so that the set of power devices #1-#N+1 can correspond to a plurality of different addressing signals respectively. In response to that the main power source is switched to the standby power source or the standby power source is switched to the main power source, for example, after the main power source 120 is turned off or switched to the standby power source 130, when the standby power source 130 is turned on, the set of power devices #1-#N+1 are switched at different times based on the different addressing signals, so that the switched standby power source supplies power to the server node 140 through the set of power devices #1-#N+1. Additionally or alternatively, in one embodiment, whenever the power system 100 starts to operate, the set of power devices #1-#N+1 start to initially receive power from the power source 10; for example, the set of power devices #1-#N+1 start to initially receive power from the main power source 120 or the standby power source 130. In the meanwhile, the inrush current caused by the equivalent capacitive load in the downstream circuits (e.g., an EMI filter, a PFC and so on) of the power devices #1-#N+1 causes the upstream transformer of the power source 10 to be instantaneously overloaded. In practice, the initial power source (e.g., the main power source 120 or the standby power source 130) can be a limited ability power source, such as a tidal-power generator, a diesel generator, a solar energy supply circuit or the like, and thus the inrush current caused by the aforesaid capacitive load may be higher. It should be noted that mains electric power (i.e., utility power, household power or city power) is a relatively unlimited ability power source. For reducing the inrush current caused by the capacitive load, in response to that the set of power devices #1-#N+1 start to initially receive power from the power source 10, the set of power devices #1-#N+1 are switched at different times based on the different addressing signals, so that the power source 10 supplies the power to the server node 140 through the set of power devices #1-#N+1. In this way, the inrush current caused by the capacitive load can be reduced or dispersed, so as to avoid the instantaneous overload of the transformer.

In practice, each of the power device #1-#N+1 has an automatic transfer switch 150, and the automatic transfer switches 150 perform above switching operations on the power device #1-#N+1. For example, each of the power device #1-#N+1 can be an AC to DC converter (which may include an EMI filter, a PFC and a DC to DC converter). The main power source 120 can be commercial power, and the standby power source 130 can be an uninterruptible power system, a power generator and/or a similar device. The server node 140 in FIG. 1 can be a computer host in the server.

In FIG. 1, the set of power devices #1-#N+1 are disposed in a server rack 170, and each of the set of power devices #1-#N+1 is a detachable power device, so as to facilitate maintenance and/or to adjust the number of the power devices in the set of power devices #1-#N+1.

In one embodiment of the present disclosure, the addressing line 110 can be a software communication bus and/or a hardware bus. The addressing signal operates in the server rack 170 through the software communication bus or the hardware bus. For example, the hardware bus can be a dip switch or variable resistance/voltage components that are directly electrically connected or indirectly electrically coupled, so that each of the power device #1-#N+1 (e.g., detachable power devices) inserted in the server rack 170 can obtain the addressing signal correspondingly through the hardware bus. Alternatively, the software communication bus can make the power devices #1-#N+1 (e.g., detachable power devices) inserted in the server rack 170 specify the addresses through communication.

Figure 2:
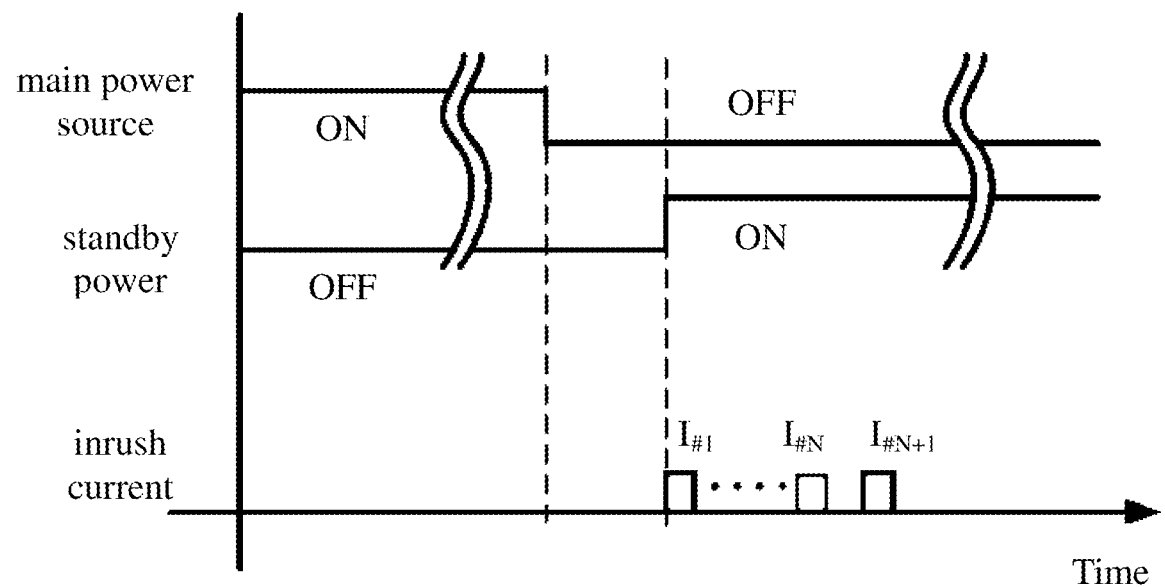
FIG. 2 is a timing diagram of the power system of FIG. 1 in operation.

For a more complete understanding of switching operations of the power system 100, referring FIGS. 1-2, FIG. 2 is a timing diagram of the power system of FIG. 1 in operation. After the main power source 120 is turned off or switched to the standby power source 130, when the standby power source 130 is turned on, the set of power devices #1-#N+1 are switched at different times based on the different addressing signals, and therefore the inrush current $I_{\#1}$-$I_{\#N+1}$ corresponding to the set of power devices #1-#N+1 are dispersed, so as to avoid power being tripped off resulted from the inrush currents superimposed at the same point time.

In view of above, the power system 100 in FIG. 1 is backup switching circuit architecture with low inrush current, where this new architecture can effectively disperse the inrush current in a single system through the addressing signals.

Figure 3:
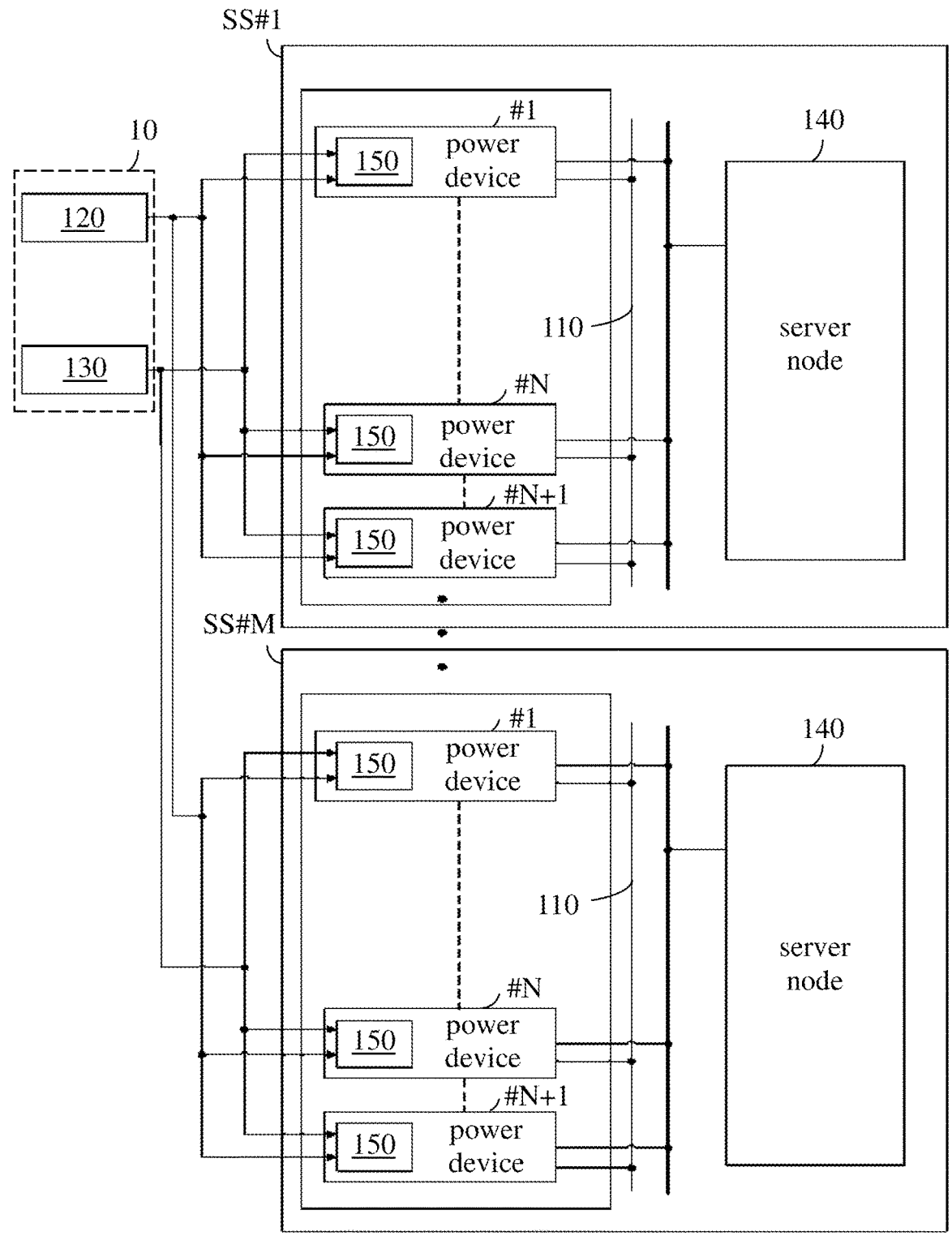
FIG. 3 is a block diagram of the power system according to another embodiment of the present disclosure.

FIG. 3 is a block diagram of a power system 300 according to one embodiment of the present disclosure. Compared with the single system of the power system 100 in FIG. 1, the power system 300 in FIG. 3 is expanded into multiple subsystems architecture. As shown in FIG. 3, the power system 300 includes a plurality of subsystems SS #1-SS #M. In structure, the subsystems SS #1-SS #M are electrically connected to the main power source 120 and the standby power source 130. Each of the subsystems SS #1-SS #M includes the set of power devices #1-#N+1, the addressing line 110 and the server node 140. The multiple server nodes 140 in FIG. 3 can be parts of the host computers in the server.

In FIG. 3, the subsystems SS #1-SS #M can be a plurality of subsystem cabinets. In each of the subsystem cabinets, each of the set of power devices #1-#N+1 can be the detachable power device, so as to facilitate maintenance and/or to adjust the number of the power devices in the set of power devices #1-#N+1.

In each of the subsystems SS #1-SS #M, the addressing line 110 is electrically connected to the set of power devices #1-#N+1, so that the set of power devices #1-#N+1 can correspond to a plurality of different addressing signals. For example, the power device #1 obtains a first addressing signal and has a first addressing location, the power device #N obtains a $N_{th}$ addressing signal and has a $N_{th}$ addressing location, and power device #N+1 obtains a $(N+1)_{th}$ addressing signal and has a $(N+1)_{th}$ addressing location. Therefore, in the subsystems SS #1-SS #M, each of respective power devices #1 corresponds to the first addressing signal; in the subsystems SS #1-SS #M, each of respective power devices #N corresponds to the $N_{th}$ addressing signal; in the subsystems SS #1-SS #M, each of respective power devices #N+1 corresponds to the $(N+1)_{th}$ addressing signal.

In use, after the main power source 120 is turned off or switched to the standby power source 130, when the standby power source 130 is turned on, corresponding power devices of the sets of power devices #1-#N+1 of the subsystems SS #1-SS #M in correspondence with a corresponding addressing signal of the different addressing signals are switched in a corresponding time interval. For example, the corresponding power devices #1 corresponding to the first addressing signal are switched in a first time interval, the corresponding power devices #N corresponding to the $N_{th}$ addressing signal are switched in the $N_{th}$ time interval, and the corresponding power devices #N+1 corresponding to the $(N+1)_{th}$ addressing signal are switched in the $(N+1)_{th}$ time interval. The first time interval, . . . , the $N_{th}$ time interval and the $(N+1)_{th}$ time interval are continued but are not overlapped.

Additionally or alternatively, in one embodiment, whenever the power system 100 starts to operate, the set of power devices #1-#N+1 start to initially receive power from the power source 10. When the set of power devices #1-#N+1 start to initially receive power from the power source 10, corresponding power devices of the sets of power devices #1-#N+1 of the subsystems SS #1-SS #M in correspondence with a corresponding addressing signal of the different addressing signals are switched in a corresponding time interval. For example, whenever the power system 100 starts to operate, the corresponding power devices #1 corresponding to the first addressing signal are switched in a first time interval, the corresponding power devices #N corresponding to the $N_{th}$ addressing signal are switched in the $N_{th}$ time interval, and the corresponding power devices #N+1 corresponding to the $(N+1)_{th}$ addressing signal are switched in the $(N+1)_{th}$ time interval. The first time interval, . . . , the $N_{th}$ time interval and the $(N+1)_{th}$ time interval are continued but are not overlapped.

Figure 4:
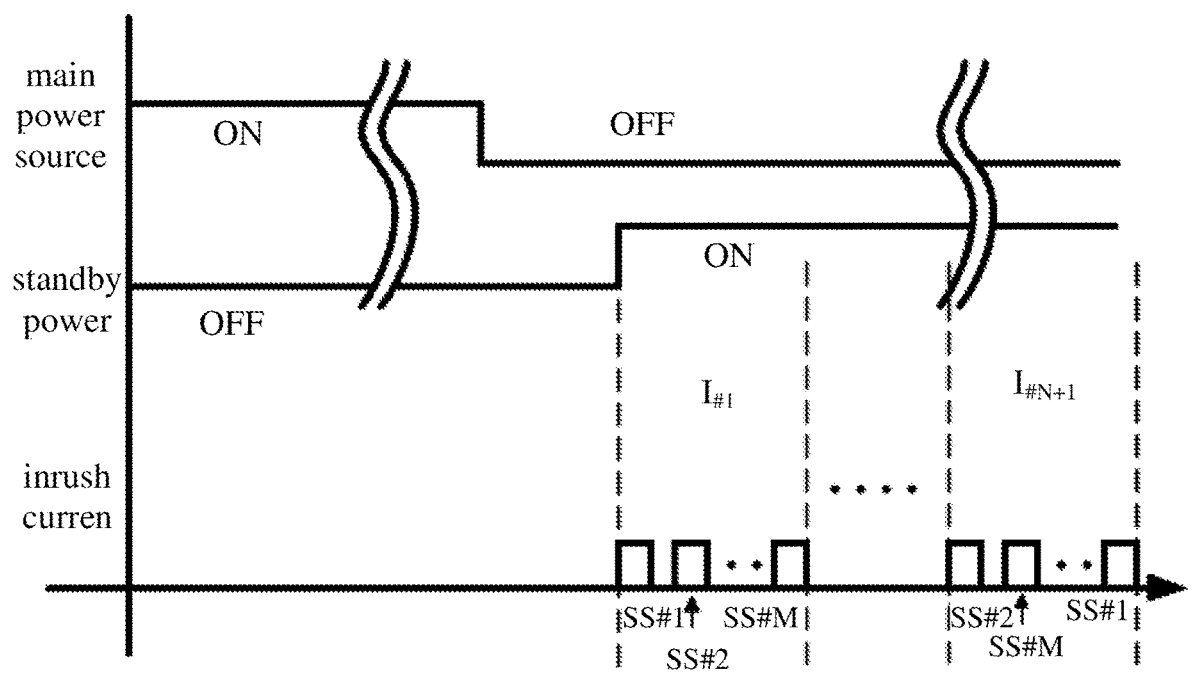
FIG. 4 is a timing diagram of the power system of FIG. 3 in operation.

For a more complete understanding of switching operations of the power system 300, referring FIGS. 3-4, FIG. 4 is a timing diagram of the power system 300 of FIG. 3 in operation. After the main power source 120 is turned off or switched to the standby power source 130, when the standby power source 130 is turned on, the addressing signal corresponding to above corresponding power devices has a parameter of a jitter time. Therefore, the corresponding power devices are switched at different time points in the corresponding time interval based on the parameter of the jitter time of the corresponding addressing signal. In practice, the parameter of the jitter time can be random numbers.

For example, by using the parameter of the jitter time of the first addressing signal, the corresponding power devices #1 in the subsystems SS #1, SS #2-SS #M corresponding to the first addressing signal are switched at different time points in the first time interval. Therefore, the inrush currents $I_{\#1}$ generated by the power devices #1 are dispersed, so as to avoid the power being tripped off resulted from the inrush currents $I_{\#1}$ superimposed at the same point time.

Similarly, by using the parameter of the jitter time of the $(N+1)_{th}$ addressing signal, the corresponding power devices #N+1 in the subsystems SS #1, SS #2-SS #M corresponding to the $(N+1)_{th}$ addressing signal are switched at different time points in the first time interval. Therefore, the inrush currents $I_{\#N+1}$ generated by the power devices #N+1 are dispersed, so as to avoid power being tripped off resulted from the inrush currents $I_{\#N+1}$ superimposed at the same point time.

In view of above, the decentralized switching control strategy of the power system 300 in FIG. 3 is to add a jitter time to each addressing signal to improve the inrush current superposition generated at the switching moment of the conventional backup circuit, and to effectively reduce the tripping of the upstream circuit breaker. In addition, jitter time is added to each addressing signal; when various large data centers with M numbers of subsystems perform backup switching, it can effectively avoid the inrush current superposition caused by switching the power devices having the same address location at the same switching, thereby improving the reliability and stability of the server power input stage circuit.

Figure 5:
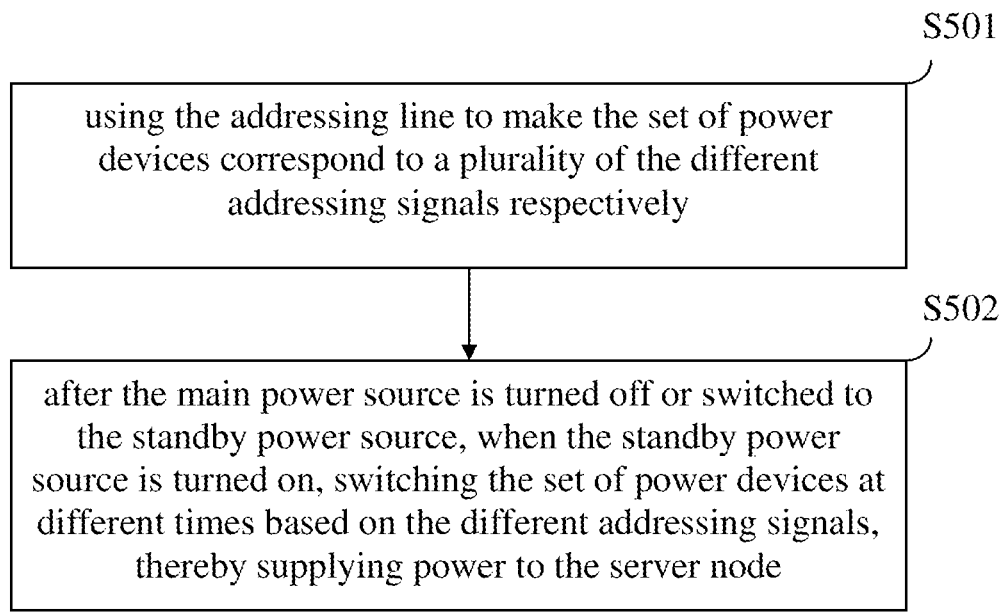
FIG. 5 is a flow chart of an operation method of the power system according to one embodiment of the present disclosure.

For a more complete understanding of an operation method of the power systems 100 and 300, referring FIGS. 1-5, FIG. 5 is a flow chart of an operation method 500 of the power systems 100 and 300 according to one embodiment of the present disclosure. As shown in FIG. 5, the operation method 500 includes operations S501 and S502. However, as could be appreciated by persons having ordinary skill in the art, for the steps described in the present embodiment, the sequence in which these steps is performed, unless explicitly stated otherwise, can be altered depending on actual needs; in certain cases, all or some of these steps can be performed concurrently.

In FIGS. 1 and 3, the power systems 100 and 300 include the set of power devices #1-#N+1 and the addressing line 110. In operation S501, the addressing line 110 is used to make the set of power devices #1-#N+1 correspond to a plurality of the different addressing signals respectively, where the set of power devices #1-#N+1 are electrically connected to the main power source 120, the standby power source 130 and the server node 140.

In operation S502, after the main power source 120 is turned off or switched to the standby power source 130, when the standby power source 130 is turned on, the set of power devices #1-#N+1 are switched at different times based on the different addressing signals, thereby supplying power to the server node 140.

In FIG. 3, the power system 300 further includes a plurality of subsystems SS #1-SS #M. Each of the subsystems SS #1-SS #M includes the set of power devices #1-#N+1, the addressing line 110 and the server node 140. In operation method 500, after the main power source 120 is turned off or switched to the standby power source 130, when the standby power source 130 is turned on, corresponding power devices of the sets of power devices #1-#N+1 of the subsystems SS #1-SS #M in correspondence with a corresponding addressing signal of the different addressing signals are switched in a corresponding time interval. Thus, the inrush currents are dispersed in different time intervals.

In operation method 500, the above addressing signal has a parameter of a jitter time. Therefore, the corresponding power devices are switched at different time points in the corresponding time interval based on the parameter of the jitter time of the corresponding addressing signal, so as to avoid the power being stripped off resulted from the inrush currents superimposed at the same point time.

Figure 6:
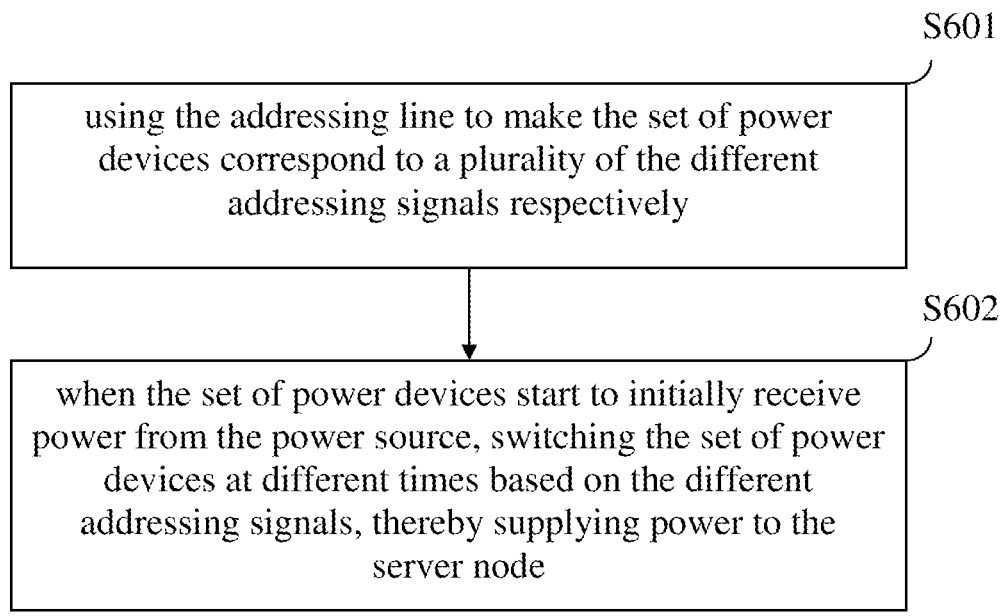
FIG. 6 is a flow chart of an operation method of the power system according to another embodiment of the present disclosure.

FIG. 6 is a flow chart of an operation method of the power system according to another embodiment of the present disclosure. As shown in FIG. 6, the operation method 600 includes operations S601 and S602. However, as could be appreciated by persons having ordinary skill in the art, for the steps described in the present embodiment, the sequence in which these steps is performed, unless explicitly stated otherwise, can be altered depending on actual needs; in certain cases, all or some of these steps can be performed concurrently.

In FIGS. 1 and 3, the power systems 100 and 300 include the set of power devices #1-#N+1 and the addressing line 110. In operation S601, the addressing line 110 is used to make the set of power devices #1-#N+1 correspond to a plurality of the different addressing signals respectively, where the set of power devices #1-#N+1 are electrically connected to the power source 10 and the server node 140.

In operation S602, when the set of power devices #1-#N+1 start to initially receive power from the power source 10, the set of power devices #1-#N+1 are switched at different times based on the different addressing signals, thereby supplying power to the server node 140.

In operation method 600, when the set of power devices start to initially receive power from the power source, corresponding power devices of the sets of power devices of the subsystems in correspondence with a corresponding addressing signal of the different addressing signals are switched in a corresponding time interval.

In operation method 600, the above addressing signal has a parameter of a jitter time. Therefore, the corresponding power devices are switched at different time points in the corresponding time interval based on the parameter of the jitter time of the corresponding addressing signal.

In operation S602, in one embodiment, in response to that the set of power devices #1-#N+1 start to initially receive power from the main power source 120, the set of power devices are switched at different times based on the different addressing signals. For example, the main power source 120 can be a limited ability power source.

In operation S602, in another embodiment, in response to that the set of power devices #1-#N+1 start to initially receive power from the standby power source 130, the set of power devices are switched at different times based on the different addressing signals. For example, the standby power source 130 can be a limited ability power source.

It should be noted that although the operations of the power devices in the aforementioned embodiments is performed on the condition that the main power source is switched to the standby power source (i.e., the standby power source is substituted for the main power source to supply power), the operations of the power devices are also adapted in the condition that the standby power source is switched to the main power source for supplying power (i.e., the standby power source is turned off and the main power source is turned on). The operations thereof is similar to those in the aforementioned embodiments, and thus the further description is not given herein.

Technical advantages are generally achieved, by embodiments of the present disclosure. The power system and the operation method can effectively reduce and disperse the inrush current.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A power system, comprising:
    a set of power devices electrically connected to a main power source, a standby power source and a server node; and
    an addressing line electrically connected to the set of power devices, so that the set of power devices correspond to a plurality of different addressing signals respectively, wherein the set of power devices are switched at different times based on the different addressing signals, so that one of the main power source or the standby power source supplies power to the server node though the set of power devices.

2. The power system of claim 1, further comprising:
    a plurality of subsystems electrically connected to the main power source and the standby power source, and each of the subsystems comprising the set of power devices, the addressing line and the server node, wherein corresponding power devices of the sets of power devices of the subsystems in correspondence with a corresponding addressing signal of the different addressing signals are switched in a corresponding time interval.

3. The power system of claim 2, wherein the corresponding power devices are switched at different time points in the corresponding time interval based on a parameter of a jitter time of the corresponding addressing signal.

4. The power system of claim 2, wherein the subsystems are a plurality of subsystem cabinets, and each of the power devices in each of the subsystems is a detachable power device.

5. The power system of claim 1, wherein the set of power devices are disposed in a server rack, and each of the power devices is a detachable power device.

6. The power system of claim 1, wherein each of the power devices is an AC to DC converter.

7. The power system of claim 6, wherein each of the power devices comprises an automatic transfer switch, and the automatic transfer switch performs a corresponding switching operation so that the power is supplied from one of the main power source or the standby power source to the AC to DC converter.

8. An operation method of the power system, the power system comprising a set of power devices and an addressing line, and the operation method comprising:
    using the addressing line to make the set of power devices correspond to a plurality of different addressing signals respectively, wherein the set of power devices are electrically connected to a main power source, a standby power source and a server node; and
    in response to that the main power source is switched to the standby power source or the standby power source is switched to the main power source, switching the set of power devices at different times based on the different addressing signals, so that the switched standby power source or the switched main power source supplies power to the server node through the set of power devices.

9. The operation method of claim 8, wherein the power system further comprises a plurality of subsystems, each of the subsystems comprises the set of power devices, the addressing line and the server node, and the operation method further comprises:

in response to that the main power source is switched to the standby power source or the standby power source is switched to the main power source, corresponding power devices of the sets of power devices of the subsystems in correspondence with a corresponding addressing signal of the different addressing signals are switched in a corresponding time interval.

10. The operation method of claim 9, further comprising:

switching the corresponding power devices at different time points in the corresponding time interval based on a parameter of a jitter time of the corresponding addressing signal.

11. An operation method of the power system, the power system comprising a set of power devices and an addressing line, and the operation method comprising:

using the addressing line to make the set of power devices correspond to a plurality of different addressing signals respectively, wherein the set of power devices are electrically connected to a power source and a server node; and in response to that the set of power devices start to initially receive power from the power source, switching the set of power devices at different times based on the different addressing signals, so that the power source supplies the power for the server node through the set of the power devices.

12. The operation method of claim 11, wherein the power system further comprises a plurality of subsystems, each of the subsystems comprises the set of power devices, the addressing line and the server node, and the operation method further comprises:

in response to that the set of power devices start to initially receive power from the power source, corresponding power devices of the sets of power devices of the subsystems in correspondence with a corresponding addressing signal of the different addressing signals are switched in a corresponding time interval.

13. The operation method of claim 12, further comprising:

switching the corresponding power devices at different time points in the corresponding time interval based on a parameter of a jitter time of the corresponding addressing signal.

14. The operation method of claim 11, wherein the power source comprises a main power source, and in response to that the set of power devices start to initially receive power from the power source, switching the set of power devices at different times based on the different addressing signals comprises:

in response to that the set of power devices start to initially receive power from the main power source, switching the set of power devices at different times based on the different addressing signals.

15. The operation method of claim 14, wherein the main power source is a limited ability power source.

16. The operation method of claim 11, wherein the power source comprises a standby power source, and in response to that the set of power devices start to initially receive power from the standby power source, switching the set of power devices at different times based on the different addressing signals comprises:

in response to that the set of power devices start to initially receive power from the standby power source, switching the set of power devices at different times based on the different addressing signals.

17. The operation method of claim 16, wherein the standby power source is a limited ability power source.

* * * * *